(12) United States Patent
Koide

(10) Patent No.: US 12,337,509 B2
(45) Date of Patent: Jun. 24, 2025

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Hiroyuki Koide, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 524 days.

(21) Appl. No.: 17/116,934

(22) Filed: Dec. 9, 2020

(65) Prior Publication Data

US 2021/0187797 A1  Jun. 24, 2021

(30) Foreign Application Priority Data

Dec. 18, 2019 (JP) .................................. 2019-228212

(51) Int. Cl.
  *B29C 37/00* (2006.01)
  *B29C 35/08* (2006.01)
  *G03F 7/00* (2006.01)
(52) U.S. Cl.
  CPC .......... *B29C 37/0057* (2013.01); *B29C 35/08* (2013.01); *G03F 7/0002* (2013.01)
(58) Field of Classification Search
  CPC ... B29C 35/08–0805; B29C 2035/0822–0861; G03F 7/0002
  See application file for complete search history.

(56) References Cited

U.S. PATENT DOCUMENTS

| 2005/0158419 | A1 | 7/2005 | Watts |
| 2009/0026657 | A1* | 1/2009 | Nimmakayala ....... G03F 9/7049 264/293 |
| 2017/0351173 | A1* | 12/2017 | Funabashi ............. G03F 9/7076 |
| 2018/0301331 | A1* | 10/2018 | Yoshida ................ G03F 7/0002 |

FOREIGN PATENT DOCUMENTS

| JP | 2019-021762 A | 2/2019 |
| JP | 2019-67918 A | 4/2019 |
| JP | 2019-125656 A | 7/2019 |
| KR | 20180116747 A | 10/2018 |

* cited by examiner

*Primary Examiner* — Dah-Wei D. Yuan
*Assistant Examiner* — Stephen A Kitt
(74) *Attorney, Agent, or Firm* — Canon U.S.A., Inc. I.P. Division

(57) ABSTRACT

An imprint apparatus which performs imprint processing by using a mold having a protruding portion and by bringing the protruding portion into contact with a composition on a substrate, the imprint apparatus comprising: a first illumination unit configured to emit light that cures the composition; a second illumination unit configured to emit light that cures the composition; and a control unit configured to perform control processing such that the composition at a position corresponding to a first region of the protruding portion is irradiated with the light from the first illumination unit and perform control processing such that the composition at a position corresponding to a second region outside the first region of the protruding portion is irradiated with the light from the second illumination unit.

7 Claims, 13 Drawing Sheets

CROSS SECTION TAKEN ALONG A-A'

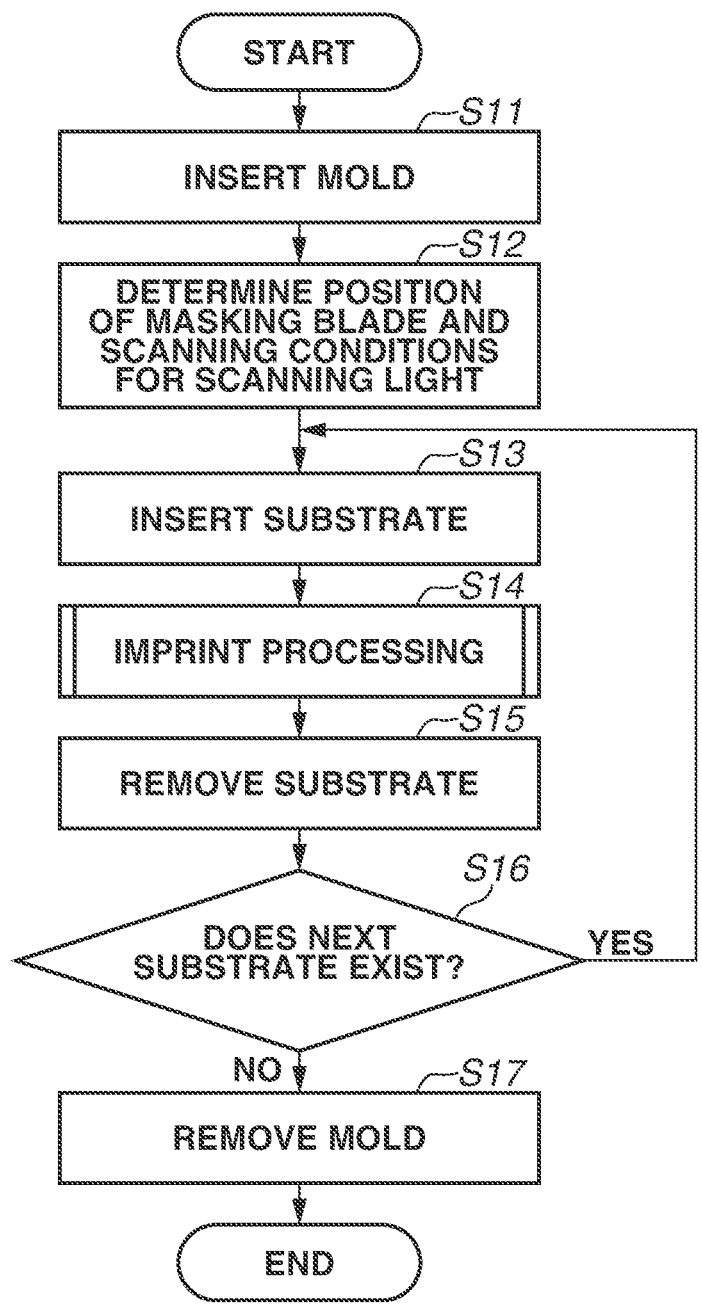

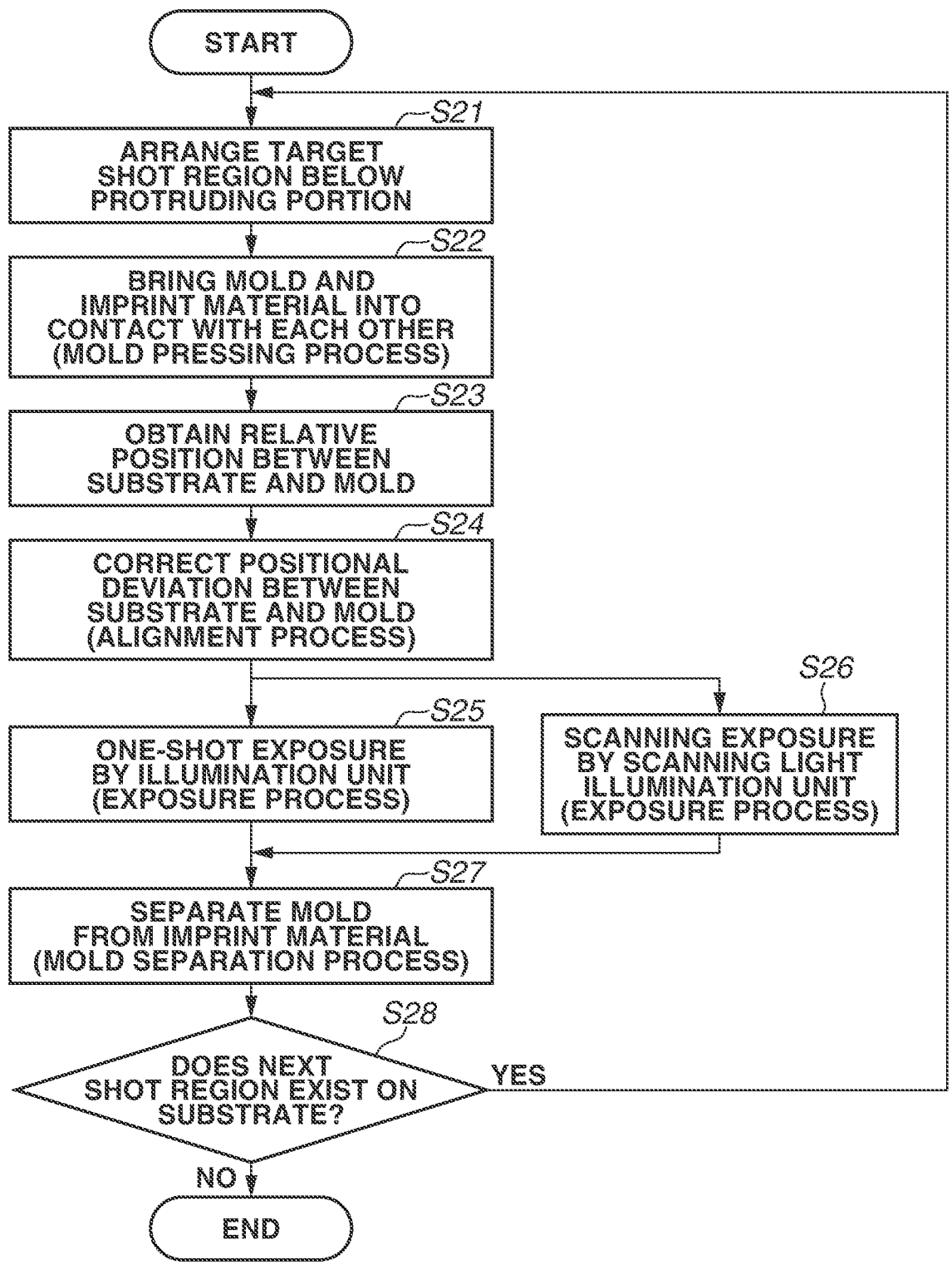

CROSS SECTION TAKEN ALONG A-A'

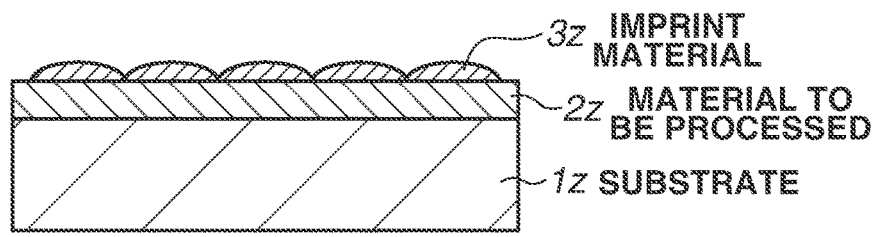
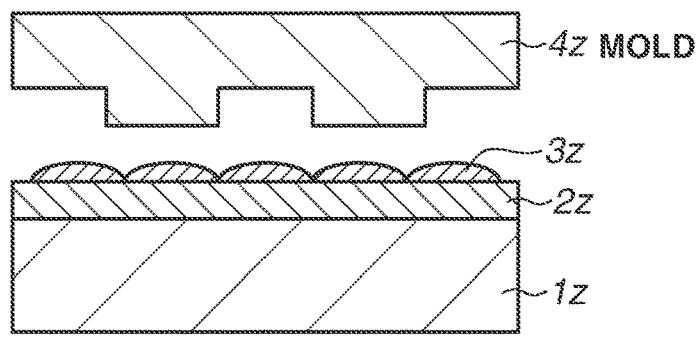
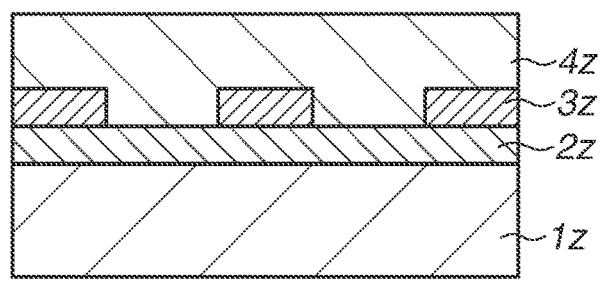
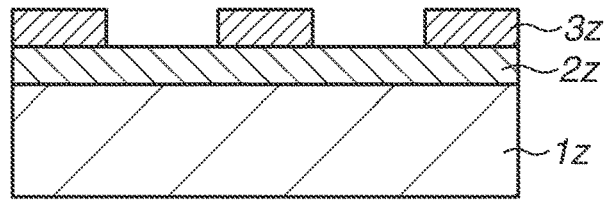
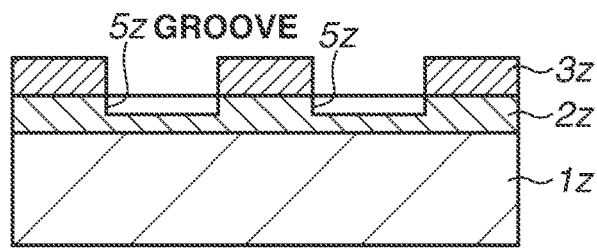
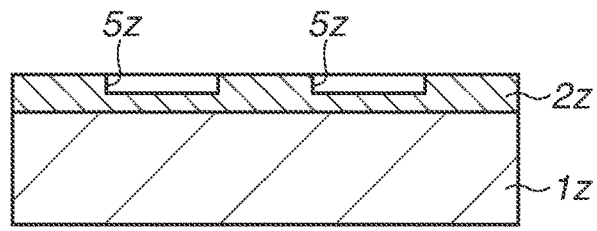

IMPRINT APPARATUS, IMPRINT METHOD, AND METHOD OF MANUFACTURING ARTICLE

BACKGROUND OF THE INVENTION

Field of the Invention

The present disclosure relates to an imprint apparatus, an imprint method, and a method of manufacturing an article.

Description of the Related Art

As a method for manufacturing articles such as semiconductor devices and micro electro mechanical systems (MEMSs), there has been known an imprint method which performs molding on an imprint material on a substrate by using a mold. In this imprint method, an imprint material is supplied on a substrate, and the supplied imprint material and the mold are brought into contact with each other (mold pressing). Next, after the imprint material is cured in the state in which the imprint material and the mold are maintained in contact with each other, the mold is separated from the cured imprint material (mold separation). Thus, a patterned imprint material is formed on the substrate.

An imprint apparatus brings an imprint material on a substrate into contact with a mold. Next, after sufficiently filling a concave portion of a concave-convex pattern formed on the mold with the imprint material, the imprint apparatus cures the imprint material. The imprint material needs to be prevented from being protruded (spreading) to the outside of a pattern region formed on the mold while the imprint material and the mold are maintained in contact with each other. Japanese Patent Laid-Open No. 2019-67918 discusses an imprint apparatus that irradiates an outer peripheral region of a pattern region of a mold with light that increases the viscosity of an imprint material.

According to Japanese Patent Application Laid-Open No. 2019-67918, while the imprint material and the mold are maintained in contact with each other, the imprint apparatus irradiates the peripheral region of the pattern region of the mold with light, so as to increase the viscosity of the imprint material in the peripheral region first. However, since the imprint apparatus also irradiates a region outside the pattern region of the mold with the light, this irradiation cures an uncured imprint material previously arranged outside the pattern region of the mold and an imprint material that has protruded to the outside of the pattern region.

SUMMARY OF THE INVENTION

The present disclosure is directed to providing an imprint apparatus that does not irradiate, even in a case where an imprint material exists outside a pattern region of a mold, the outside of the pattern region of the mold with light that cures the imprint material.

According to one aspect of the present disclosure, there is provided an imprint apparatus which performs imprint processing by using a mold having a protruding portion that protrudes from a base and by bringing the protruding portion into contact with a composition on a substrate, the imprint apparatus comprising: a mold holding unit configured to hold the mold; a substrate holding unit configured to hold the substrate on which the composition is disposed; a light quantity measuring unit mounted on the substrate holding unit; a driving unit configured to drive at least one of the mold holding unit and the substrate holding unit such that the composition and the protruding portion of the mold are brought into contact with each other; a first illumination unit configured to emit light that cures the composition; a second illumination unit configured to emit light that cures the composition; and a control unit configured to perform control processing such that the composition at a position corresponding to a first region of the protruding portion is irradiated with the light from the first illumination unit and perform control processing such that the composition at a position corresponding to a second region outside the first region of the protruding portion is irradiated with the light from the second illumination unit, while the composition and the protruding portion are maintained in contact with each other, wherein the control unit adjusts a position of an irradiation region of the second illumination unit such that an outer peripheral region of the mold is irradiated with the light from the second illumination unit, based on a measurement result obtained by the light quantity measuring unit.

Further features of the present disclosure will become apparent from the following description of exemplary embodiments with reference to the attached drawings.

BRIEF DESCRIPTION OF THE DRAWINGS

FIG. 4 is a flowchart illustrating processing performed by the imprint apparatus.

FIG. 5 is a flowchart illustrating imprint processing.

FIGS. 13A to 13F illustrate an article manufacturing method.

DESCRIPTION OF THE EMBODIMENTS

Figure 1:
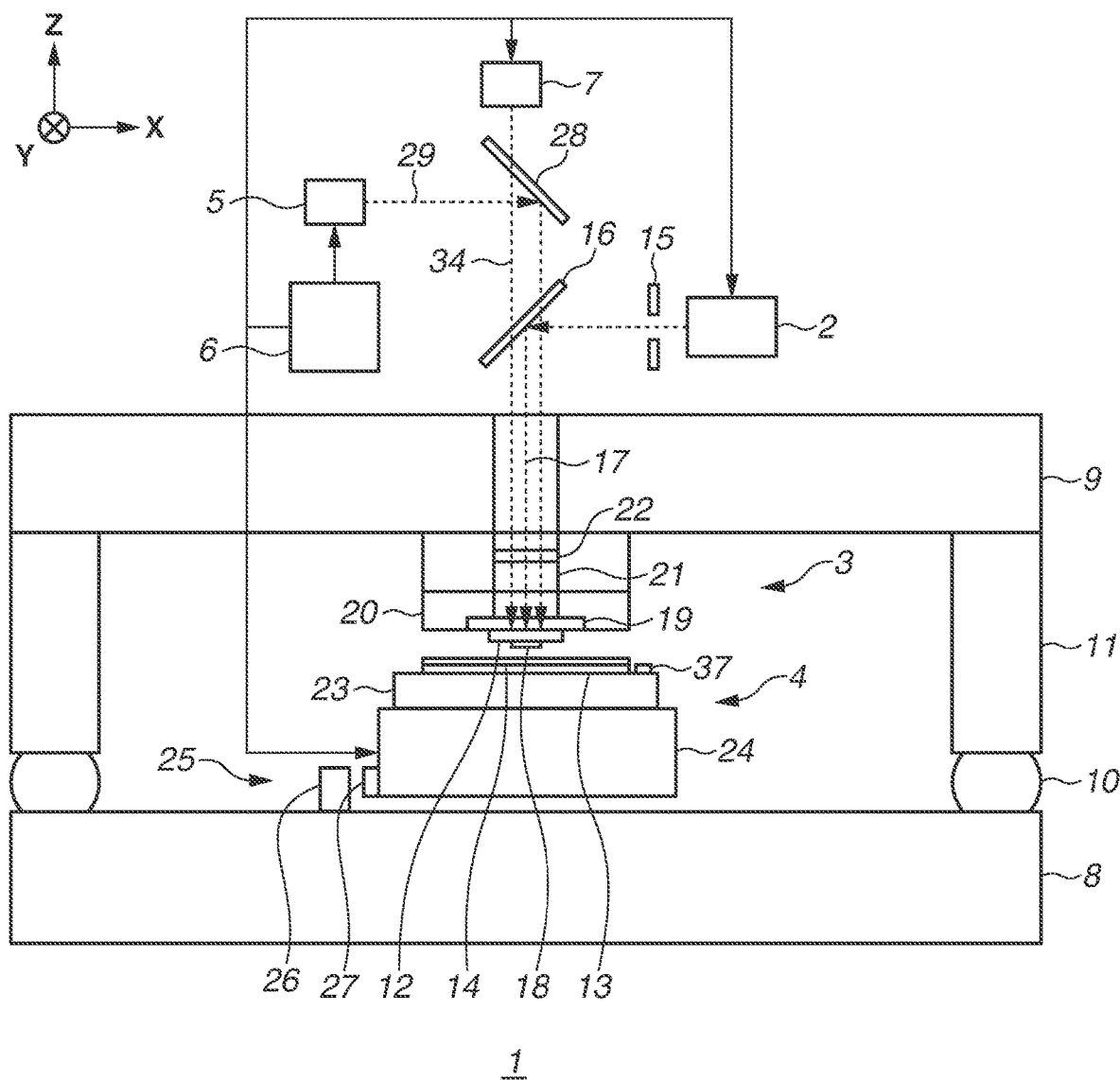
FIG. 1 schematically illustrates a configuration of an imprint apparatus according to a first exemplary embodiment.

Hereinafter, suitable exemplary embodiments of the present disclosure will be described in detail with reference to the drawings. In each drawing, like members are denoted by like reference characters, and redundant description thereof will be avoided.

First Exemplary Embodiment

FIG. 1 schematically illustrates a configuration of an imprint apparatus 1 as one aspect of the present disclosure. The imprint apparatus 1 is a lithography apparatus which is used for manufacturing a device such as a semiconductor device as an article and performs imprint processing for forming a pattern of an imprint material (also referred to as a composition) on a substrate by using a mold. In the present exemplary embodiment, the imprint apparatus 1 brings the imprint material supplied on the substrate and the mold into contact with each other and applies curing energy to the imprint material so that a pattern of curing product to which the concave-convex pattern of the mold is transferred can be formed.

A curable composition (also referred to as an uncured resin) that is cured by curing energy applied thereto is used as the imprint material. An electromagnetic wave, heat, or the like is used as the curing energy. As the electromagnetic wave, for example, light such as infrared light, visible light, and ultraviolet light selected from a range of wavelengths of 10 nm or more and 1 mm or less is used.

The curable composition is a composition that is cured by irradiation with light or heating. A photo-curable composition, which is cured by irradiation with light, contains at least a polymerizable compound and a photo-polymerization initiator and may contain a non-polymerizable compound or a solvent, if needed. The non-polymerizable compound is at least one kind selected from a group of a sensitizer, a hydrogen donor, an internal addition type release agent, a surfactant, an antioxidant, and a polymer component.

The imprint material may be applied onto the substrate in the form of a film by using a spin coater or a slit coater. Alternatively, the imprint material may be applied onto the substrate in the form of a droplet or in the form of islands or a film formed with a plurality of connected droplets by using a liquid ejecting head. The viscosity (a viscosity at 25° C.) of the imprint material is, for example, 1 mPa·s or more and 100 mPa·s or less.

As the substrate, glass, ceramic, metal, semiconductor, or resin material is used, for example. As needed, a member made of material different from that of the substrate may be formed on a surface of the substrate. Specifically, examples of the substrate include a silicon wafer, a compound semiconductor wafer, and quartz glass.

According to the present exemplary embodiment, the imprint apparatus 1 adopts a photo-curing method as a method for curing the imprint material. As illustrated in FIG. 1, a direction parallel to an optical axis of an illumination unit that irradiates the imprint material on the substrate with light is an Z axis, and directions perpendicular to each other in a plane orthogonal to the Z axis are an X axis and a Y axis. A substrate 13 is disposed on the XY plane.

The imprint apparatus 1 includes an illumination unit 2 (a first illumination unit), a mold holding mechanism 3, a substrate stage 4, a scanning light illumination unit 5 (a second illumination unit), a control unit 6, and an alignment measuring unit 7. In addition, the imprint apparatus 1 includes a base plate 8 on which the substrate stage 4 is mounted, a bridge plate 9 that fixes the mold holding mechanism 3, and a support 11 that is extended from the base plate 8 and supports the bridge plate 9 via a vibration isolator 10. The vibration isolator 10 reduces (eliminates) vibrations transferred from a floor surface to the bridge plate 9. Furthermore, the imprint apparatus 1 includes a mold conveyance unit (not illustrated) that conveys a mold 12 from the outside to the mold holding mechanism 3, a substrate conveyance unit (not illustrated) that conveys the substrate 13 from the outside to the substrate stage 4, etc.

In the imprint processing, the illumination unit 2 irradiates an imprint material 14 on the substrate 13 with ultraviolet light 17 that cures the imprint material 14 via a masking blade 15 (a light-shielding member), a dichroic mirror 16, and the mold 12. The illumination unit 2 includes, for example, a light source that emits light having a wavelength band of 400 nm and an optical element that adjusts the ultraviolet light 17 emitted from the light source so as to be suitable for the imprint processing. The masking blade 15 is a light-shielding plate used for limiting the irradiation range of the ultraviolet light 17 emitted from the illumination unit 2 to the substrate 13. As will be described in detail below, the masking blade 15 is arranged between the mold 12 and the illumination unit 2 and can adjust the irradiation range of the ultraviolet light 17 in a rectangular shape. The irradiation region formed by the masking blade 15 is arranged to be appropriately adjustable. When performing exposure, the illumination unit 2 collectively irradiates the irradiation region determined by the position of the masking blade 15 with the ultraviolet light 17.

The mold 12 is used for performing molding on the imprint material on the substrate. The mold 12 may also be called a template or an original. The mold 12 has a polygonal (rectangular) outer peripheral shape. Near the center of a surface facing the substrate 13, a portion protruding from a surrounding base 12b (also referred to as a protruding portion 18 or a mesa portion) is formed. The protruding portion 18 includes a pattern region in which a pattern (a concave-convex pattern) to be transferred onto the imprint material 14 on the substrate 13 is formed. The imprint processing is performed by bringing this region of the protruding portion 18 into contact with the imprint material 14.

Figure 2A:
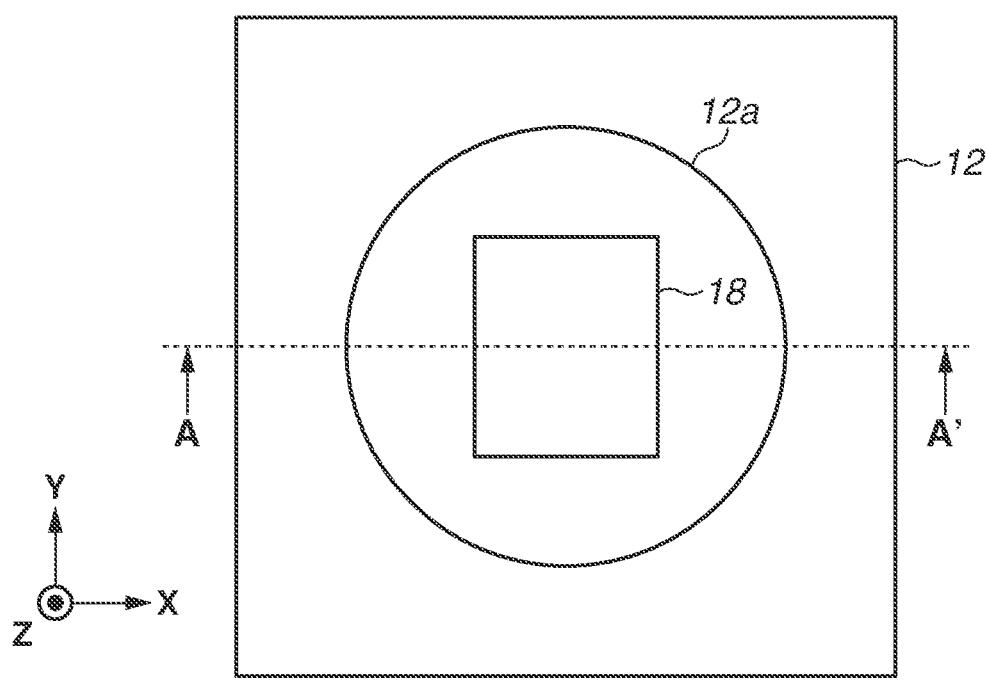
FIG. 2A is a plan view illustrating a mold viewed from a Z-axis direction.
Figure 2B:
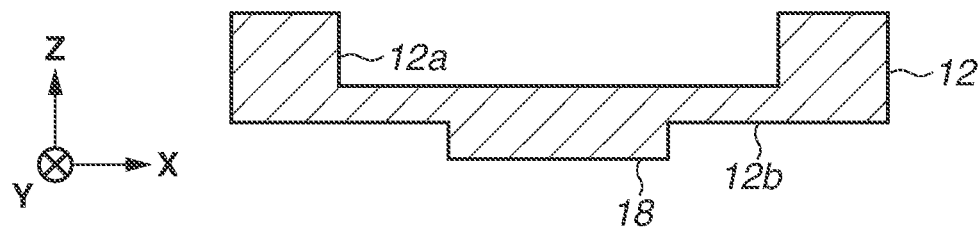
FIG. 2B illustrates a cross section of the mold.

FIGS. 2A and 2B illustrate the mold 12 that can be used in the imprint apparatus according to the present exemplary embodiment. FIG. 2A is a plan view of the mold 12 viewed from the Z-axis direction. FIG. 2B is a cross section taken along A-A' of the mold 12 illustrated in FIG. 2A. On the protruding portion 18 of the mold 12, a concave-convex pattern, such as a circuit pattern, to be transferred to the substrate 13 is three-dimensionally formed. The mold 12 is made of material such as quartz, which transmits the ultraviolet light 17. In addition, a cavity 12a (a concave portion) that facilitates deformation of the mold 12 (the protruding portion 18) is formed on an opposite surface (a surface on the incident side of the ultraviolet light 17) of the surface facing the substrate 13. The cavity 12a has a circular planar shape, and the depth thereof is appropriately set based on the size and material of the protruding portion 18. Viewed from the Z-axis direction, the cavity 12a is formed to have a region larger than the protruding portion 18. The protruding portion 18 is arranged to be positioned in a center portion of the cavity 12a.

The mold holding mechanism 3 includes a mold holding unit 19 that holds the mold 12 and a mold driving unit 20 that holds the mold holding unit 19 and moves the mold 12 (the mold holding unit 19).

The mold holding unit 19 holds the mold 12 by attracting the outer peripheral region of the surface on the incident side of the ultraviolet light 17 of the mold 12 by vacuum suction force or electrostatic force. For example, in a case where the mold holding unit 19 holds the mold 12 by vacuum suction force, the mold holding unit 19 is connected to a vacuum pump externally installed, and attachment and detachment (holding and release of holding) of the mold 12 is switched by turning on and off of the vacuum pump.

The mold driving unit 20 moves the mold 12 in the Z-axis direction to selectively perform pressing (mold pressing process) of the protruding portion 18 of the mold 12 against the imprint material 14 on the substrate 13 or separating (mold separation process) of the protruding portion 18 of the mold 12 from the imprint material 14 on the substrate 13. Examples of an actuator applicable to the mold driving unit 20 include a linear motor and an air cylinder. To accurately position the mold 12, the mold driving unit 20 may be configured with a plurality of drive systems such as a coarse movement drive system and a fine movement drive system. The mold driving unit 20 is configured to be capable of moving the mold 12 not only in the Z-axis direction but also in the X- and Y-axis directions. Furthermore, the mold driving unit 20 may be configured to have a tilt function to adjust the position of the mold 12 in a θ (rotation around the Z axis) direction and the tilt of the mold 12.

The mold pressing process and the mold separation process by the imprint apparatus 1 may be performed by moving the mold 12 in the Z-axis direction as described in the present exemplary embodiment or by moving the substrate 13 (the substrate stage 4) in the Z-axis direction. Alternatively, the mold pressing process and the mold separation process may be performed by relatively moving both of the mold 12 and the substrate 13 in the Z-axis direction.

Each of the mold holding unit 19 and the mold driving unit 20 has an opening 21 in the center portion (the inner side) so that the illumination unit 2 can irradiate the imprint material 14 on the substrate 13 with the ultraviolet light 17. In the opening 21, a light transmission member 22 is disposed to create an enclosed space by using the space surrounded by a part of the opening 21 and the cavity 12a of the mold 12. A pressure adjustment apparatus including a vacuum pump, etc. adjusts the pressure applied to the inside of the enclosed space. For example, when the imprint material 14 on the substrate 13 and the mold 12 are brought into contact with each other, the pressure adjustment apparatus increases the pressure inside the enclosed space to be higher than the pressure outside so as to bent (deform) the protruding portion 18 of the mold 12 towards the substrate 13 in a convex form. As a result, a part (for example, a center portion) of the pattern region formed on the protruding portion 18 is allowed to be first brought into contact with the imprint material 14 on the substrate 13. This prevents air from being left between the mold 12 and the imprint material 14, and the concave-convex pattern of the protruding portion 18 of the mold 12 can be thoroughly filled with the imprint material 14. In this way, the pattern is formed on the imprint material 14 on the substrate 13 by the protruding portion 18 of the mold 12.

The substrate stage 4 holds the substrate 13 and is used for alignment between the mold 12 and the substrate 13 when the imprint material 14 on the substrate 13 and the mold 12 are brought into contact with each other. The substrate stage 4 includes a substrate holding unit 23 that holds the substrate 13 by suction and a stage driving unit 24 that mechanically holds and moves the substrate holding unit 23 in each axis direction.

Examples of an actuator applicable to the stage driving unit 24 include a linear motor and a planar motor. To accurately position the substrate 13, the stage driving unit 24 may be configured with a plurality of drive systems such as a coarse movement drive system and a fine movement drive system in each of the X- and Y-axis directions. Alternatively, the stage driving unit 24 may be configured to be capable of moving the substrate 13 not only in the X- and Y-axis directions but also in the Z-axis direction. Furthermore, the stage driving unit 24 may be configured to have a tilt function to adjust the position of the substrate 13 in the θ (rotation around the Z axis) direction and the tilt of the substrate 13.

An encoder system 25 that corresponds to each of the X-, Y-, and Z-axis directions is disposed on a side surface of the substrate stage 4. The encoder system 25 measures the position of the substrate stage 4 by irradiating an encoder scale 27 with a beam emitted from an encoder head 26. The encoder system 25 measures the position of the substrate stage 4 in real time. The control unit 6 performs positioning of the substrate stage 4 based on the values measured by the encoder system 25. An interferometer may be used in place of the encoder system for the positioning measurement of the substrate stage 4.

The scanning light illumination unit 5 (the second illumination unit) scans and irradiates a desired position on the substrate 13 with a beam of ultraviolet light 29 via a dichroic mirror 28 so as to cure the imprint material 14.

Figure 3:
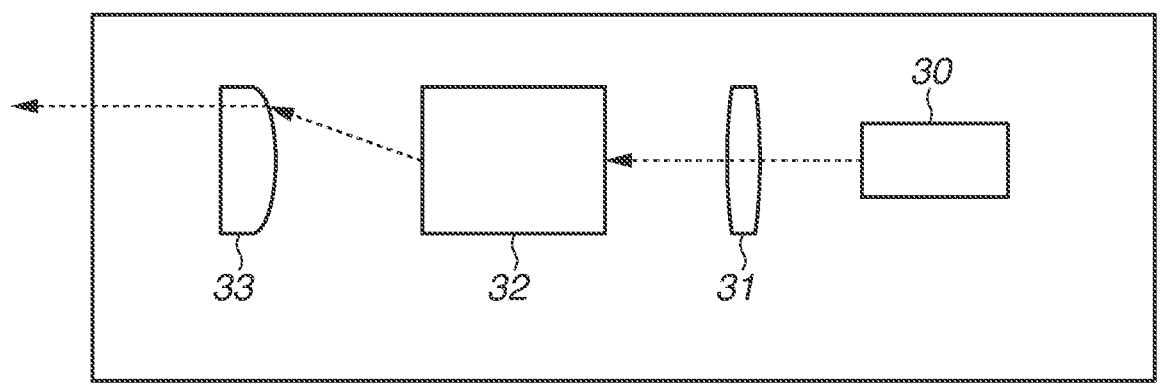
FIG. 3 schematically illustrates a scanning light illumination unit.

FIG. 3 schematically illustrates a configuration of the scanning light illumination unit 5. A light source unit 30 emits light having a wavelength for curing the imprint material 14. For example, the light source unit 30 emits light having a wavelength band of 400 nm. While the light source unit 30 of the scanning light illumination unit 5 according to the present exemplary embodiment uses a light source different from that of the illumination unit 2, the scanning light illumination unit 5 and the illumination unit 2 may use light from the same light source to irradiate the imprint material 14.

The spot shape of the light emitted from the light source unit 30 is adjusted into a beam-like form by an optical element 31, and the adjusted light is guided to a scanning element 32. The scanning element 32 (a scanning unit) is a scanning mechanism for moving the beam light from the optical element 31 on the substrate 13 in the XY-plane direction. By irradiating, via an optical element 33, the imprint material 14 on the substrate 13 with the beam of ultraviolet light 29 moved by the scanning element 32, the imprint material 14 can be cured. As the scanning element 32, for example, a galvano scanner, a micro electro mechanical system (MEMS) mirror device, or the like can be used.

The control unit 6 is configured by a computer including a central processing unit (CPU), a memory, etc. and controls various units in the imprint apparatus 1 in accordance with a program stored in the memory. The control unit 6 controls the imprint processing for forming a pattern on the substrate by controlling operations and adjustments of various units in the imprint apparatus 1. Further, according to the present exemplary embodiment, the control unit 6 can control the irradiation region of the masking blade 15 and the scanning operation with the beam of light from the scanning light illumination unit 5, based on the type of the mold 12 (the shape of the protruding portion 18) held by the mold holding unit 19. In addition, the control unit 6 may be configured integrally with the other elements of the imprint apparatus 1 (in the same housing) or separately from the other elements of the imprint apparatus 1 (in a separate housing).

The alignment measuring unit 7 irradiates the mold 12 and the substrate 13 with alignment light 34 when the imprint processing is performed and measures an amount of relative misalignment between the mold 12 and the substrate 13, etc. by detecting the alignment light 34 reflected by the mold 12 and the substrate 13. The amount of relative misalignment or the like that has been measured in this step is used when the mold driving unit 20 and the stage driving unit 24 are adjusted to reduce the misalignment. In addition, the misalignment can also be reduced by changing the shape of the protruding portion 18 of the mold 12 or an imprint region of the substrate 13 by using a shape correction unit (not illustrated).

The present exemplary embodiment has been described by using an example in which the imprint material 14 is previously supplied to the entire surface of the substrate 13 before the substrate 13 is inserted (loaded) into the imprint apparatus 1. However, the imprint material may be supplied by using a method in which a supply unit (a dispenser) arranged in the imprint apparatus 1 supplies (applies) an uncured imprint material onto the substrate 13. In this case, the imprint material may be collectively supplied (applied) onto the entire surface of the substrate 13 or may be supplied (applied) onto each region (shot region) on which the imprint processing is to be performed on the substrate 13.

Next, the imprint processing using the imprint apparatus 1 according to the present exemplary embodiment will be described with reference to FIGS. 4 and 5. FIG. 4 is a flowchart illustrating processing performed by the imprint apparatus 1 from inserting the mold 12 into the imprint apparatus 1 to removing the mold 12 from the imprint apparatus 1. FIG. 5 is a flowchart illustrating the imprint processing for forming a pattern in step S14 in FIG. 4. This imprint processing is performed by the control unit 6 comprehensively controlling the individual units of the imprint apparatus 1.

When the processing starts, first, in step S11, the control unit 6 causes the external mold conveyance unit (not illustrated) or the like to convey the mold 12 to the mold holding mechanism 3 and causes the mold holding unit 19 to suction-hold the mold 12 (insertion of the mold).

In step S12, the control unit 6 determines the position of the masking blade 15 such that a region smaller than that of the protruding portion 18 of the mold 12, which has been inserted in step S11, is to be irradiated. Further, in step S12, scanning conditions are determined such that light from the scanning light illumination unit 5 scans a region (a peripheral region of the pattern region) of the protruding portion 18 shielded by the masking blade 15 so as not to be irradiated with the light.

Figure 6A:
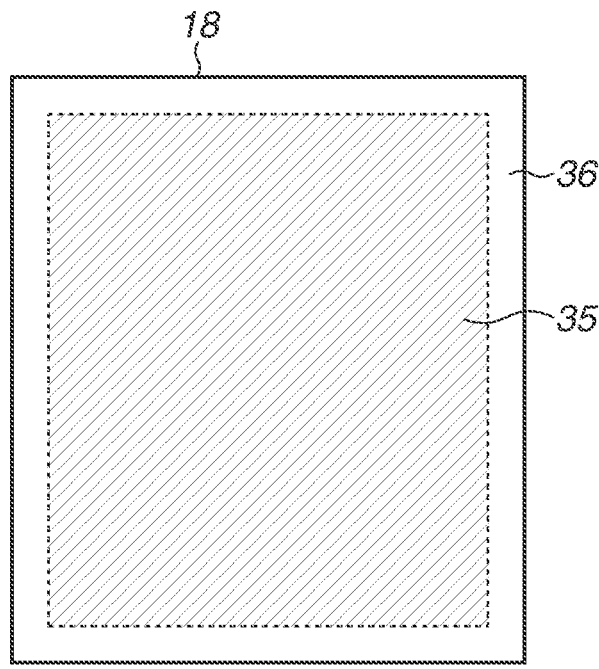
FIG. 6A illustrates an irradiation region when a protruding portion of the mold is viewed from the Z-axis direction.
Figure 6B:
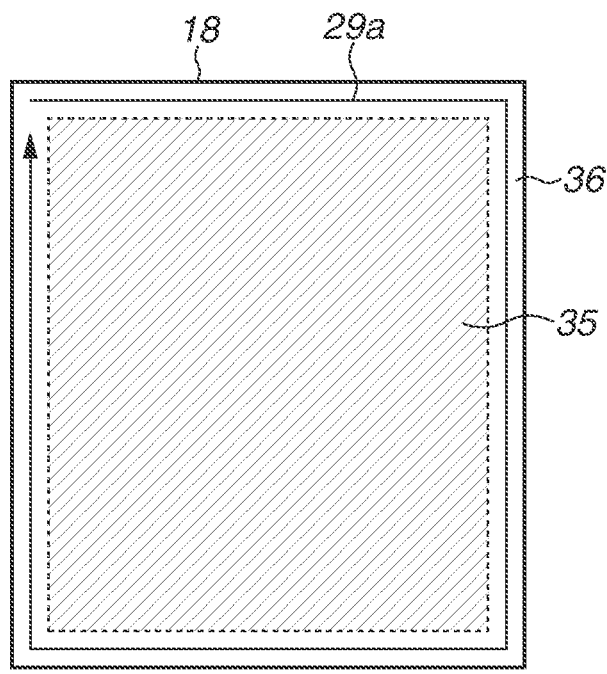
FIG. 6B illustrates scanning exposure.

FIGS. 6A to 6B each illustrate an irradiation region when the protruding portion 18 of the mold 12 is viewed from the Z-axis direction. FIG. 6A illustrates an irradiation region 35 (a first region) and a scanning region 36 (a second region) that are determined in step S12. FIG. 6B illustrates a scanning trajetory 29a formed by scanning with the beam of ultraviolet light 29 from the scanning light illumination unit 5. While FIGS. 6A and 6B illustrate a relationship between the protruding portion 18 of the mold 12 and the irradiation region 35, a pattern region of a corresponding mold or a shot region formed on the substrate 13 may be used in place of the protruding portion 18.

When the irradiation region is determined in step S12, if the mold 12 has been inserted into a predetermined position in step S11, there is no need to adjust the positions of the masking blade 15 and the scanning region 36 every time the mold 12 is inserted therein. However, when the mold 12 is conveyed to the mold holding unit 19, an initial misalignment could occur in the X-axis direction, the Y-axis direction, or the rotation direction in the XY plane. Consequently, the scanning region 36 of the beam of ultraviolet light 29 emitted from the scanning light illumination unit 5 could have an initial misalignment in the irradiation position with respect to the target position.

Figure 7:
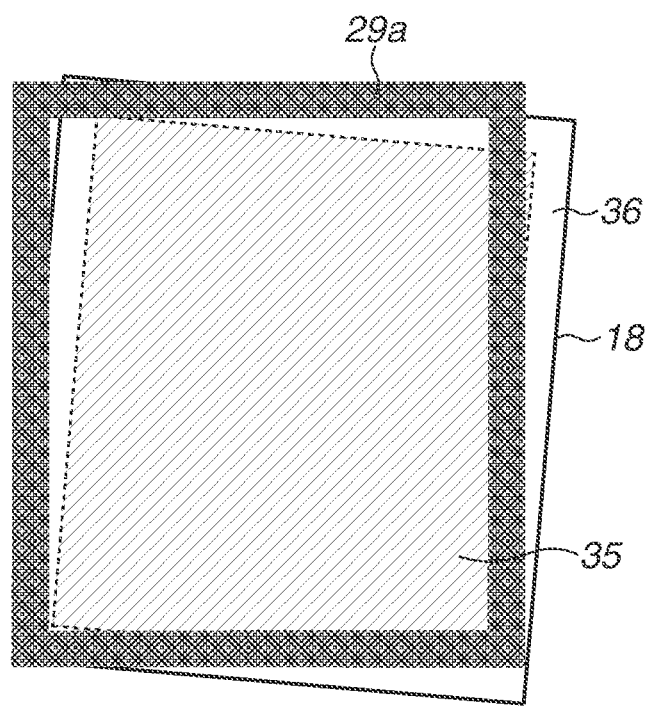
FIG. 7 illustrates a case where scanning conditions for the scanning light illumination unit are not optimal.

As a result, as illustrated in FIG. 7, the scanning light illumination unit 5 could irradiate the outside of the pattern region of the protruding portion 18 of the mold 12 with the ultraviolet light 29 and unnecessarily cure an uncured imprint material supplied to an adjacent shot region. In addition, since a misalignment between the scanning trajectory 29a formed by the scanning light illumination unit 5 and the scanning region 36 set for the protruding portion 18 occurs as illustrated in FIG. 7, unevenness in the connection between the irradiation region 35 of the illumination unit 2 and the scanning region 36 of the scanning light illumination unit 5 could occur. FIG. 7 illustrates an example of an irradiation state in which the scanning trajectory 29a formed by the scanning light illumination unit 5 has a misalignment in the rotation direction with respect to the pattern region (the corresponding shot region) formed on the protruding portion 18.

Figure 8:
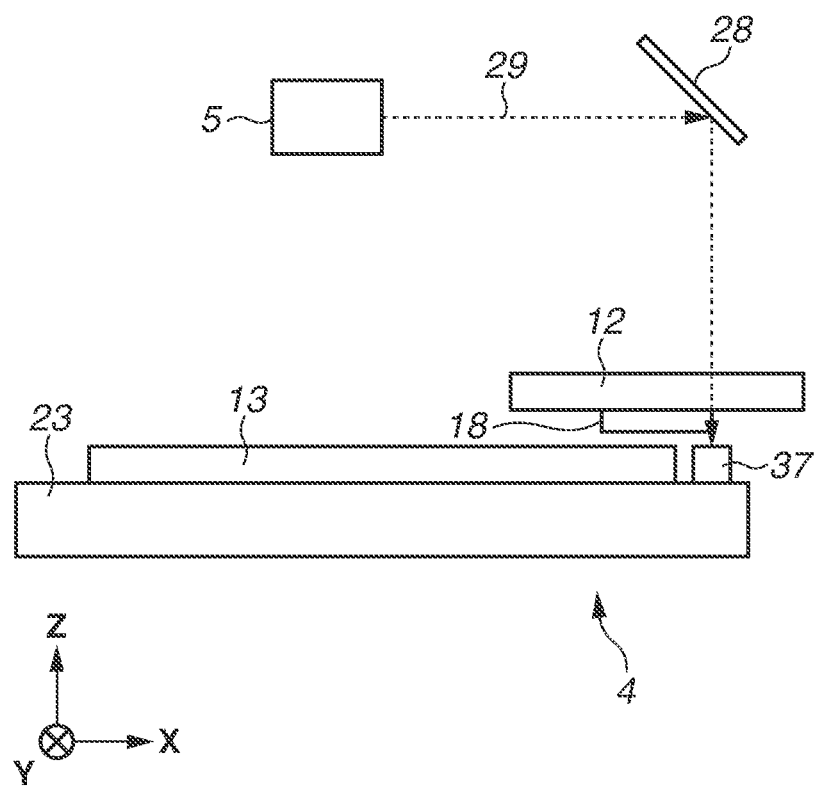
FIG. 8 illustrates a substrate stage and the mold when an irradiation region of a second illumination unit is obtained.

A method for correcting a misalignment in an irradiation region, e.g., a misalignment between the protruding portion 18 and the scanning trajectory 29a formed by the scanning light illumination unit 5, will be descried with reference to FIG. 8. In the present exemplary embodiment, a method for correcting the position of the irradiation region by using a light quantity sensor 37 (a light quantity measuring unit) mounted on the substrate stage 4 will be described. As illustrated in FIG. 8, the light quantity sensor 37 is disposed at a reference position below a side surface of the protruding portion 18 by driving the substrate stage 4 in the X and Y directions. It is desirable that the light quantity sensor 37 be a sensor capable of performing surface measurement.

Figure 9A:
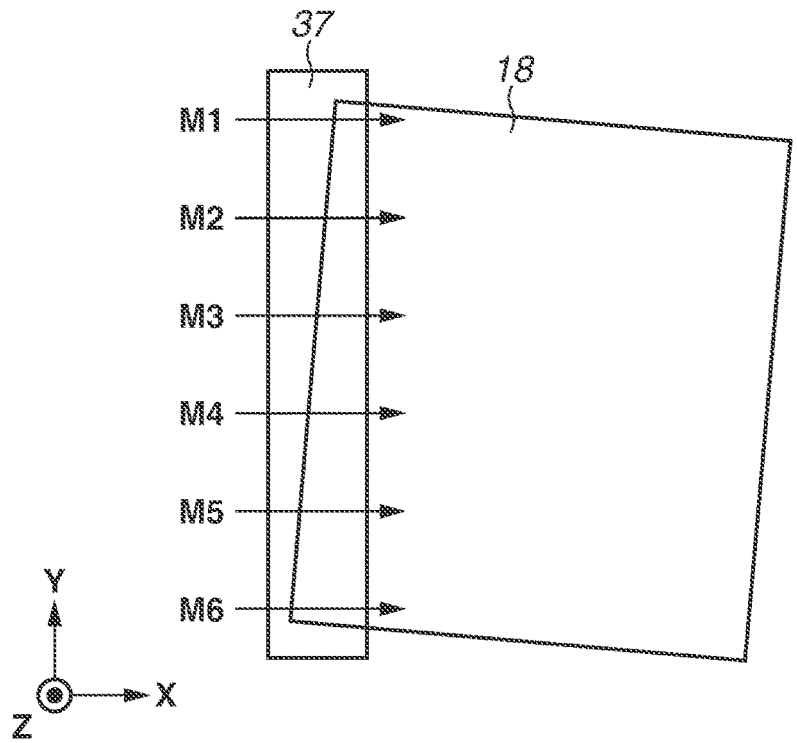
FIGS. 9A and 9B illustrate how to obtain an irradiation region of the second illumination unit.
Figure 9B:
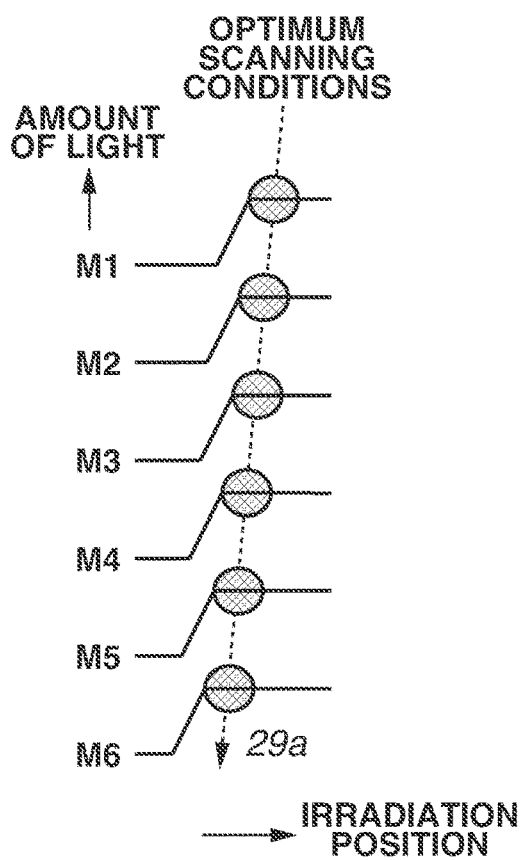

Next, the scanning light illumination unit 5 irradiates a region including the side surface (an outer peripheral region) of the protruding portion 18 with the beam of ultraviolet light 29 while freely changing the irradiation angle. For example, as illustrated in FIG. 9A, the side surface of the protruding portion 18 is scanned at certain intervals, and the position of the side surface of the protruding portion 18 is obtained for each scanning operation. The present exemplary embodiment illustrated in FIG. 9A, illustrates six scanning operations performed on one side surface of the protruding portion 18, which are indicated by measurements M1 to M6. The method for obtaining a position of the side surface of the protruding portion 18 is not limited to the above case. The scanning intervals and the number of scanning operations can be freely set. FIG. 9B illustrates measurement results obtained by the light quantity sensor 37 when the scanning operations of the measurements M1 to M6 have been performed. The position at which the largest quantity of light has been measured among the light quantities measured by the light quantity sensor 37 at the respective scanning operations can be detected as the position of the side surface of the protruding portion 18. Based on the position of the side surface of the protruding portion 18 obtained as described above, the optimum scanning position of the scanning trajectory 29a, which is the irradiation region of the scanning light illumination unit 5, can be set.

While one side surface of the protruding portion 18 has been described with reference to FIGS. 9A and 9B, the positions of the other side surfaces can be obtained in the same manner by performing scanning with the light quantity sensor 37. Based on the position of the protruding portion 18 obtained by using these results, the scanning trajectory 29a formed by the scanning light illumination unit 5 can appropriately be set. In addition, by adjusting the position of the masking blade 15 based on the obtained position of the protruding portion 18, the position of the irradiation region 35 of the illumination unit 2 can be corrected. Finally, by joining the irradiation region 35 of the illumination unit 2 and the scanning region 36 of the scanning light illumination unit 5, the irradiation region and the scanning conditions can be determined.

While, in the example in FIG. 6B, the scanning light illumination unit 5 always irradiates a certain irradiation region on the surface of the substrate 13 with the beam of ultraviolet light 29 in a constant shape, the scanning light illumination unit 5 may change the shape of the irradiation region while scanning. By controlling the position of the optical element 31 illustrated in FIG. 3, the scanning light illumination unit 5 may adjust the size of the spot shape of the beam and adjust the exposure width on the surface of the substrate 13.

FIGS. 6A and 6B illustrate an example of the scanning trajectory 29a formed by the ultraviolet light 29 that has been irradiated to make a round around the scanning region 36 surrounding the irradiation region 35 of the illumination unit 2. However, scanning conditions may be set such that the ultraviolet light 29 is irradiated to make a plurality of rounds around the scanning region 36. In addition, the adjustment of the position of the masking blade 15 and the determination of the scanning conditions for the scanning light illumination unit 5 do not necessarily need to be performed before the substrate 13 is inserted (step S13). These could be performed any time before the exposure process in steps S25 and S26.

In step S13, the control unit 6 causes the external substrate conveyance unit (not illustrated) or the like to insert (load) the substrate 13 into the imprint apparatus 1, and the substrate 13 is conveyed to be suction-held by the substrate holding unit 23 of the substrate stage 4 (insertion of the substrate). The substrate 13 inserted at this point has previously been supplied with (applied with) the imprint material on the entire surface thereof by a supply unit not illustrated.

In step S14, the control unit 6 performs the imprint processing. The imprint processing in step S14 will be described in detail below.

In step S15, the control unit 6 removes (unloads) the substrate 13, on which the imprint processing has been performed, from the substrate holding unit 23 of the substrate stage 4 and causes the external substrate conveyance unit (not illustrated) or the like to convey the substrate 13 out of the imprint apparatus 1.

In step S16, the control unit 6 determines whether there is another substrate 13 to be processed next. If there is another substrate 13 (YES in step S16), the processing returns to step S13, and this new substrate 13 is inserted into the imprint apparatus 1. If there is not another substrate 13 (NO in step S16), the processing proceeds to step S17.

In step S17, the control unit 6 causes the external mold conveyance unit (not illustrated) or the like to remove (unload) the mold 12 from the mold holding mechanism 3 of the imprint apparatus 1 (removal of the mold). This completes the processing.

Next, the imprint processing in step S14 will be described in detail. FIG. 5 is a flowchart illustrating the imprint processing performed in step 14.

In step S21, the control unit 6 drives at least one of the substrate stage 4 and the mold driving unit 20 such that a shot region of the substrate 13, on which the imprint processing is to be performed, is arranged below the protruding portion 18 of the mold 12.

In step S22, the control unit 6 brings the protruding portion 18 of the mold 12 and the imprint material 14 on the substrate 13 into contact with each other (mold pressing process). Specifically, the control unit 6 drives the mold driving unit 20 in the Z-axis direction while adjusting the pressure in the space formed by the cavity 12a so as to bring the protruding portion 18 of the mold 12 and the imprint material 14 on the substrate 13 into contact with each other without leaving air bubbles therebetween. In this step, it is preferable that the control unit 6 bring the protruding portion 18 and the imprint material 14 into contact with each other while making adjustments to fill the concave-convex pattern formed in the pattern region of the protruding portion 18 with the imprint material 14.

In step S23, the control unit 6 causes the alignment measuring unit 7 to measure a relative position between alignment marks formed on the substrate 13 and the mold 12 and obtain a relative misalignment.

In step S24, the control unit 6 drives at least one of the substrate stage 4 and the mold holding mechanism 3 and bring the substrate 13 and the mold 12 into alignment with each other so as to reduce the relative misalignment obtained in step S23.

In step S25, the control unit 6 performs control processing such that the irradiation region 35 (the first region) is irradiated via the masking blade 15 positioned in step S12 with the ultraviolet light 17 from the illumination unit 2 (exposure process). Specifically, one-shot exposure is performed on the irradiation region 35 illustrated in FIG. 6B by the illumination unit 2 so that the imprint material 14 in the region which is in contact with the irradiation region 35 of the protruding portion 18 is cured.

In step S26, the control unit 6 controls the scanning element 32 such that the scanning region 36 (the second region) is scanned with the ultraviolet light 29 from the scanning light illumination unit 5 in accordance with the scanning conditions determined in step S12 (exposure process). Specifically, the control unit 6 performs scanning with the beam of ultraviolet light 29 along the scanning trajectory 29a as illustrated in FIG. 6B so that the imprint material in the region which is in contact with the scanning region 36 of the protruding portion 18 is cured.

As illustrated in the flowchart in FIG. 5, steps S25 and S26 are performed in parallel so that the time taken for the imprint processing can be reduced. However, these steps may be performed one by one.

In step S27, the control unit 6 separates the protruding portion 18 (the pattern region) of the mold 12 from the cured imprint material 14 (mold separation process). Specifically, by driving the mold driving unit 20 in the Z-axis direction while adjusting the pressure in the space formed by the cavity 12a, the control unit 6 separates the cured imprint material 14 from the mold 12. In the mold separation process, instead of moving the mold 12 in the Z-axis direction, the control unit 6 may move the substrate 13 in the Z-axis direction or may move both the mold 12 and the substrate 13.

As described above, the imprint apparatus 1 can control the irradiation of the scanning light illumination unit 5 such that the scanning region 36 of the scanning light illumination unit 5 matches the outer periphery of the protruding portion 18. This achieves the imprint processing that maintains a good exposure state even when a misalignment of the irradiation position of the beam of light occurs due to a misalignment of the mold 12, a misalignment of the protruding portion 18, or the like.

An initial misalignment could occur when the mold 12 is conveyed to the mold holding unit 19. A misalignment could also occur to the mold 12 over time when the imprint processing is repeatedly performed. According to the present exemplary embodiment, the position of the scanning region of the scanning light is corrected in step S12. However, such correction may be performed immediately before the substrate is inserted in step S13 or immediately before the imprint processing is performed in step S14. Alternatively, the correction of the scanning region may be performed for each substrate inserted into the imprint apparatus or for each imprint processing performed on the shot region.

Figure 10:
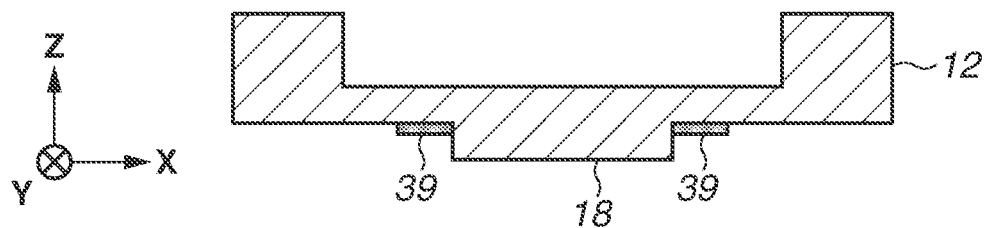
FIG. 10 illustrates the mold having light shielding units.

In addition, as illustrated in FIG. 10, as the mold 12, a mold (a chromium light shielding mask) having a region excluding the protruding portion 18 of the mold 12, at least a part of which is coated with chromium as a light shielding unit 39, may be used. It is desirable that the light shielding unit 39 be arranged in the outer peripheral region of the protruding portion 18 of the mold 12, surrounding the mesa portion. Thus, the accuracy of detecting the position (the position of the protruding portion 18) of the mold 12 by using the light quantity sensor 37 can be increased.

Second Exemplary Embodiment

Figure 11:
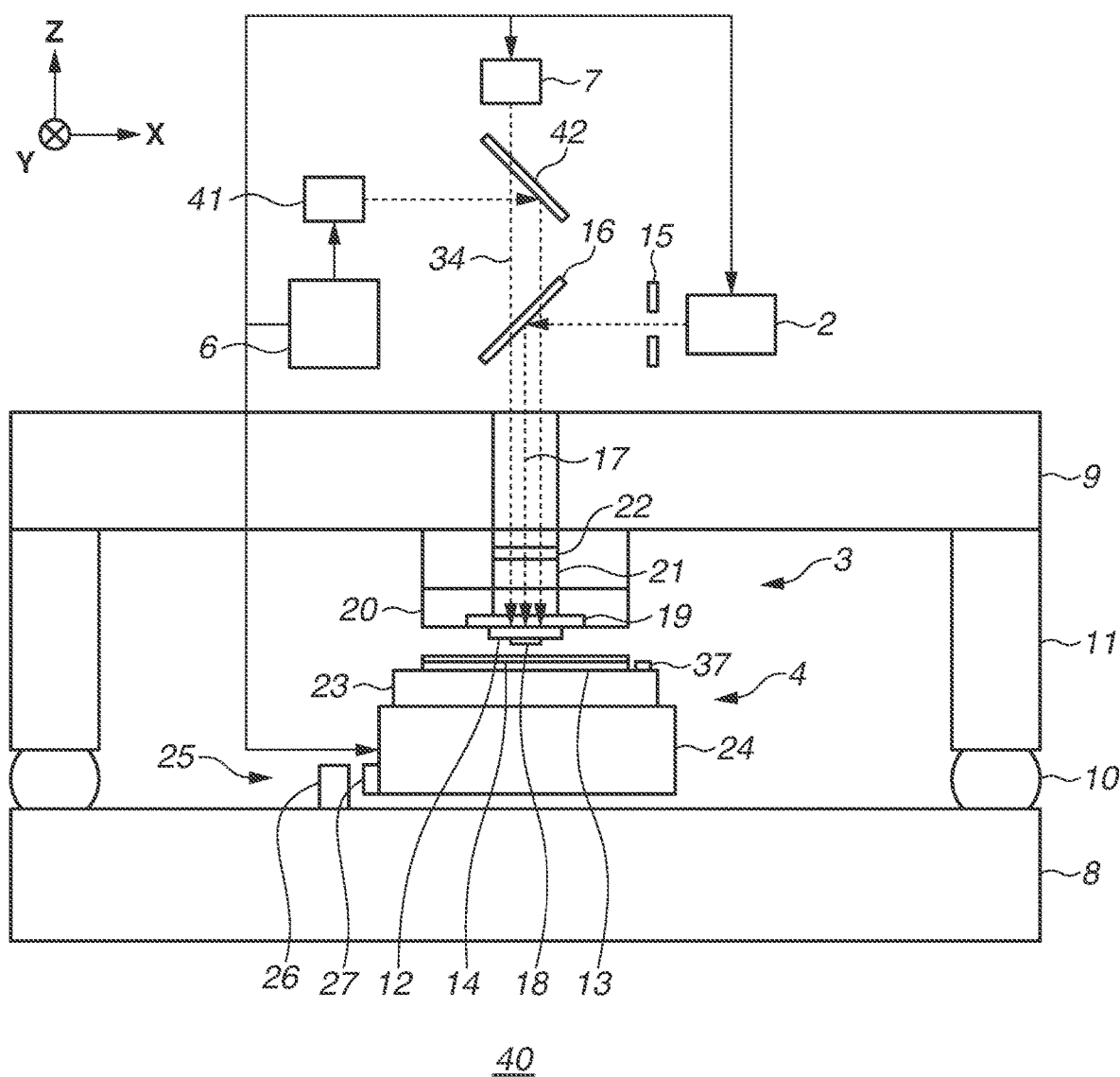
FIG. 11 schematically illustrates a configuration of an imprint apparatus according to a second exemplary embodiment.

FIG. 11 illustrates an imprint apparatus 40 according to a second exemplary embodiment. The imprint apparatus 40 according to the second exemplary embodiment will be described with reference to FIG. 11. Members that are the same as those in the imprint apparatus 1 described in the first exemplary embodiment will be denoted by the same reference characters, and redundant description will be avoided.

The imprint apparatus 1 according to the first exemplary embodiment scans a desired position on the substrate 13 with the beam of ultraviolet light 29 by using the scanning light illumination unit 5 and the dichroic mirror 28. Instead of using the above elements, the imprint apparatus 40 according to the second exemplary embodiment uses a one-shot illumination unit 41 as a second illumination unit and a light modulation device 42 (a spatial light modulation device).

A light source of the one-shot illumination unit 41 emits light having a wavelength for curing an imprint material 14 and collectively illuminates a peripheral portion of a protruding portion 18 of a mold 12. For example, the light source of the one-shot illumination unit 41 emits light having a wavelength band of 400 nm. According to the present exemplary embodiment, the one-shot illumination unit 41 uses the light source different from that of an illumination unit 2 (a first illumination unit). However, the one-shot illumination unit 41 and the illumination unit 2 may use light from the same light source to irradiate the imprint material.

As the light modulation device 42, a digital micro mirror device (hereinafter, referred to as a DMD) is used. However, the light modulation device 42 is not limited to a DMD. Other devices such as a liquid crystal device (LCD) and a liquid crystal on silicon (LCOS) device may be used. By using the light modulation device 42 between the one-shot illumination unit 41 and the substrate 13, the imprint apparatus 40 can freely set an irradiation region 43 (a second region) of the one-shot illumination unit 41.

In a method for correcting the irradiation region 43 by the imprint apparatus 40 according to the second exemplary embodiment, in step S12, as illustrated in FIG. 8, a light quantity sensor 37 is disposed at a reference position below a side surface of the protruding portion 18 by driving a substrate stage 4 in the X and Y directions. Next, the one-shot illumination unit 41 irradiates the peripheral portion including the side surface of the protruding portion 18 with ultraviolet light 29. At the same time, the setting of the irradiation region 43 is freely changed by the DMD, and the light quantity sensor 37 measures the results of the setting changes. Based on these measurements, DMD setting conditions are obtained such that the irradiation region 43 of the one-shot illumination unit 41 matches the outer periphery of the protruding portion 18.

Figure 12:
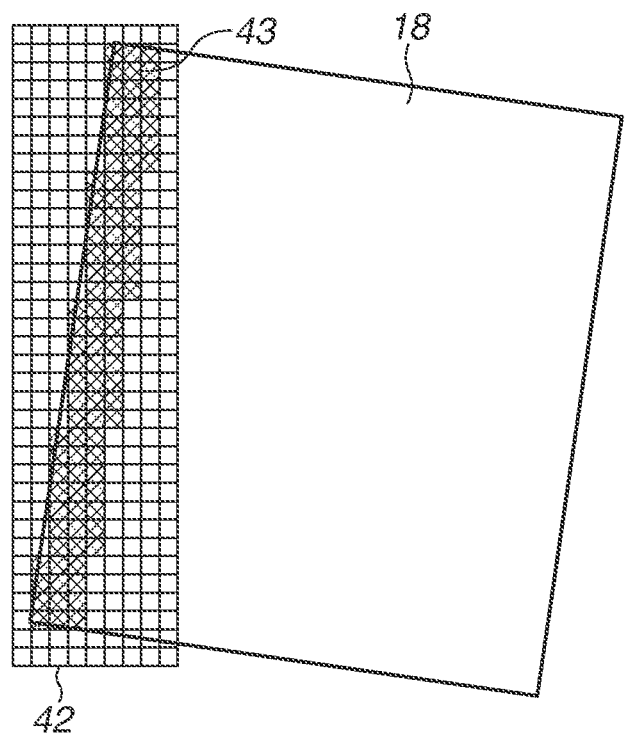
FIG. 12 illustrates an irradiation region adjusted by a light modulation device.

FIG. 12 illustrates an example in which the optimum setting is made for the DMD and the irradiation region 43 of the one-shot illumination unit 41 is determined with respect to the outer periphery of the protruding portion 18. The shaded portion in FIG. 12 represents a region to be irradiated by enabling the DMD, which is the light modulation device 42. This region is irradiated with a margin of a predetermined width from the side surface of the protruding portion 18.

In FIG. 12, the number of divisions of the DMD that indicates the resolution of the light modulation device 42 can be freely set. While a coarse resolution is used in FIG. 12 for purpose of illustration, commonly, the resolution of the DMD is approximately several tens of μm. The actual imprint apparatus 40 has a much larger number of divisions than the DMD illustrated in FIG. 12. Accordingly, finer resolution can be set.

FIG. 12 illustrates a case where the irradiation region 43 is adjusted for one side of the protruding portion 18 formed in the mold 12. By obtaining the position of the protruding portion 18 for each of the other sides of the protruding portion 18 in the same manner and performing further correction of the irradiation region 43, the optimum setting of the DMD can be determined so that the outer periphery surrounding the pattern region formed on the protruding portion 18 is irradiated with the ultraviolet light 29. Alternatively, the light quantity sensor 37 capable of measuring the entire region of the protruding portion 18 may be arranged, and the optimum setting of the DMD may be simultaneously obtained for the outer periphery surrounding the pattern region of the protruding portion 18.

The flowchart in FIG. 4 illustrating the processing performed by the imprint apparatus 1 and the flowchart in FIG. 5 illustrating the corresponding imprint processing differ from the processing according to the present exemplary embodiment in that, in steps S12 and S26 described above, the one-shot illumination unit 41 is used for illumination. Therefore, in the processing performed by the imprint apparatus 40 according to the present exemplary embodiment, the outer peripheral region of the protruding portion 18 of the mold 12 is collectively exposed (exposure process). Since the processing excluding this exposure process is the same as that according to the first exemplary embodiment, redundant description thereof will be avoided.

As described above, the imprint apparatus 40 according to the present exemplary embodiment can irradiate a desired region with the irradiation light by causing the light quantity sensor 37 to detect the position of the protruding portion 18 of the mold 12 and by adjusting the irradiation region of the one-shot illumination unit 41 (the light modulation device 42). Thus, the imprint apparatus 40 can reduce the irradiation of the outside of the pattern region with the light and the unevenness in the irradiation light in the shot region.

As described above, the imprint apparatus 40 can control the irradiation performed by the one-shot illumination unit 41 such that the irradiation region 43 of the one-shot illumination unit 41 matches the outer periphery of the protruding portion 18. This achieves the imprint processing that maintains a good exposure state even when a misalignment occurs to the irradiation position of the light with which the outer periphery is irradiated, due to a misalignment of the mold 12, a misalignment of the protruding portion 18, or the like.

(Article Manufacturing Method)

A pattern of cured product formed by using the imprint apparatus is permanently used as at least some of various articles or temporarily used when various articles are manufactured. Examples of such articles include an electrical circuit element, an optical element, a MEMS, a recording element, a sensor, and a mold. Examples of the electrical circuit element include a volatile or non-volatile semiconductor memory such as a dynamic random access memory (DRAM), a static random access memory (SRAM), a flash memory, and a magneto-resistive random-access memory (MRAM) and a semiconductor element such as a large scale integration (LSI), a charge-coupled device (CCD), an image sensor, and a field-programmable gate array (FPGA). Examples of the mold include a mold for imprinting.

The pattern of cured product is used without change or temporarily used as a resist mask as at least some of the constituent members of the above article. After etching, ion plantation, or the like has been performed in a substrate processing step, the resist mask is removed. In addition, well-known steps for processing the substrate include etching, resist separation, dicing, bonding, and packaging.

Next, a specific method for manufacturing an article will be described. As illustrated in FIG. 13A, first, a substrate $1z$ such as a silicon wafer on the surface of which work material $2z$ such as insulating material has been formed is prepared. Next, an imprint material $3z$ is applied to the surface of the work material $2z$ by an inkjet method or the like. In FIG. 13A, the imprint material $3z$, which is a plurality of droplets, is applied onto the substrate.

As illustrated in FIG. 13B, a concave-convex patterned side of a mold $4z$ for imprinting is placed to face the imprint material $3z$ on the substrate. As illustrated in 13C, the substrate $1z$ to which the imprint material $3z$ has been applied is brought into contact with the mold $4z$, and pressure is applied thereto. Space between the mold $4z$ and the work material $2z$ is filled with the imprint material $3z$. In this state, the imprint material $3z$ is irradiated with light as curing energy through the mold $4z$. Thus, the imprint material $3z$ is cured.

As illustrated in FIG. 13D, after the imprint material $3z$ has been cured, the mold $4z$ and the substrate $1z$ are separated from each other. In this way, the pattern of cured product of the imprint material $3z$ is formed on the substrate $1z$. The pattern of cured product has a shape corresponding to the shape of the mold. More specifically, a concave portion of the mold corresponds to a convex portion of the cured product, and a convex portion of the mold corresponds to a concave portion of the cured product. Namely, the concave-convex pattern of the mold $4z$ has been transferred to the imprint material $3z$.

As illustrated in FIG. 13E, if etching is performed by using the pattern of cured product as an etching resistant mask, a portion that has no cured product or a thinly remaining cured product is removed from the surface of the work material $2z$, and a groove $5z$ is created. As illustrated in FIG. 13F, when the pattern of cured product is removed, an article with a groove $5z$ formed on the surface of the work material $2z$ can be obtained. In this example, the pattern of cured product is removed. However, the pattern may be kept without being removed after the processing and used, for example, as an interlayer insulating film included in a semiconductor element or the like, namely, used as a constituent member of the article. The article manufacturing method according to the present exemplary embodiment is advantageous in at least one of performance, quality, productivity, and production cost of the article, compared with conventional methods.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-228212 filed on Dec. 18, 2019, hereby incorporated by reference herein in its entirety.

What is claimed is:

1. An imprint apparatus which performs imprint processing by using a mold having a protruding portion that protrudes from a base and by bringing the protruding portion into contact with a composition on a substrate, the imprint apparatus comprising:
   a mold holder configured to hold the mold;
   a substrate holder configured to hold the substrate on which the composition is disposed;
   a position detection device configured to acquire a position of the protruding portion of the mold held by the mold holder;
   a driver configured to drive at least one of the mold holder and the substrate holder such that the composition and the protruding portion of the mold are brought into contact with each other;
   a first illuminator configured to emit light that cures the composition;
   a second illuminator configured to emit light that cures the composition;
   a masking blade configured to limit a range of light with which the substrate is irradiated; and
   a controller configured to perform control processing such that the composition at a position corresponding to a first region of the protruding portion is irradiated with the light from the first illuminator and perform control processing such that the composition at a position corresponding to a second region outside the first region of the protruding portion is irradiated with the light from the second illuminator, while the composition and the protruding portion are maintained in contact with each other,
   wherein the second illuminator includes a scanning element configured to move a beam of the light that cures the composition on the substrate, and
   wherein the controller is configured to:
      determine a position of the masking blade such that a region smaller than a region of the protruding portion is shielded from the irradiating light,
      determine a scanning condition such that the light emitted from the second illuminator scans a periphery around the region shielded by the masking blade, and
      adjust a position of an irradiation region of the second illuminator such that an irradiation region of the second illuminator on the substrate matches an outer peripheral region of the mold, based on the position of the protruding portion of the mold acquired by the position detection device.

2. The imprint apparatus according to claim 1, wherein the controller performs control processing such that irradiation by the first illuminator and irradiation by the second illuminator are performed in parallel.

3. The imprint apparatus according to claim 1, wherein the second illuminator includes a light source configured to collectively cure the composition and a light modulation device configured to set an irradiation region on the substrate.

4. The imprint apparatus according to claim 3, comprising a digital micro mirror device as the light modulation device.

5. The imprint apparatus according to claim 1, wherein a wavelength of the light emitted from the first illuminator is different from a wavelength of the light emitted from the second illuminator.

6. A method of manufacturing an article, the method comprising:
    forming a cured product of a composition on a substrate by using an imprint apparatus; and
    processing the substrate on which the cured product of the composition is formed by the forming,
    wherein the imprint apparatus performs imprint processing by using a mold having a protruding portion that protrudes from a base and by bringing the protruding portion into contact with a composition on the substrate, and comprises:
    a mold holder configured to hold the mold;
    a substrate holder configured to hold the substrate on which the composition is disposed;
    a position detection device configured to acquire a position of the protruding portion of the mold held by the mold holder;
    a driver configured to drive at least one of the mold holder and the substrate holder such that the composition and the protruding portion of the mold are brought into contact with each other;
    a first illuminator configured to emit light that cures the composition;
    a second illuminator configured to emit light that cures the composition;
    a masking blade configured to limit a range of light with which the substrate is irradiated; and
    a controller configured to perform control processing such that the composition at a position corresponding to a first region of the protruding portion is irradiated with the light from the first illuminator and perform control processing such that the composition at a position corresponding to a second region outside the first region of the protruding portion is irradiated with the light from the second illuminator, while the composition and the protruding portion are maintained in contact with each other,
    wherein the second illuminator includes a scanning element configured to move a beam of the light that cures the composition on the substrate, and
    wherein the controller is configured to:
        determine a position of the masking blade such that a region smaller than a region of the protruding portion is shielded from the irradiating light,
        determine a scanning condition such that the light emitted from the second illuminator scans a periphery around the region shielded by the masking blade, and
        adjust a position of an irradiation region of the second illuminator such that an irradiation region of the second illuminator on the substrate matches an outer peripheral region of the mold, based on the position of the protruding portion of the mold acquired by the position detection device.

7. An imprint method for performing imprint processing, the imprint method comprising:
    forming a cured product of a composition on a substrate by using an imprint apparatus,
    wherein the imprint apparatus performs imprint processing by using a mold having a protruding portion that protrudes from a base and by bringing the protruding portion into contact with the composition on the substrate, and comprises:
    a mold holder configured to hold the mold;
    a substrate holder configured to hold the substrate on which the composition is disposed;
    a position detection device configured to acquire a position of the protruding portion of the mold held by the mold holder;
    a driver configured to drive at least one of the mold holder and the substrate holder such that the composition and the protruding portion of the mold are brought into contact with each other;
    a first illuminator configured to emit light that cures the composition;
    a second illuminator configured to emit light that cures the composition;
    a masking blade configured to limit a range of light with which the substrate is irradiated; and
    a controller configured to perform control processing such that the composition at a position corresponding to a first region of the protruding portion is irradiated with the light from the first illuminator and perform control processing such that the composition at a position corresponding to a second region outside the first region of the protruding portion is irradiated with the light from the second illuminator, while the composition and the protruding portion are maintained in contact with each other,
    wherein the second illuminator includes a scanning element configured to move a beam of the light that cures the composition on the substrate, and
    wherein the controller is configured to:
        determine a position of the masking blade such that a region smaller than a region of the protruding portion is shielded from the irradiating light,
        determine a scanning condition such that the light emitted from the second illuminator scans a periphery around the region shielded by the masking blade, and
        adjust a position of an irradiation region of the second illuminator such that an irradiation region of the second illuminator on the substrate matches an outer peripheral region of the mold, based on the position of the protruding portion of the mold acquired by the position detection device.

* * * * *